(12) United States Patent
Ohtake

(10) Patent No.: US 9,070,618 B2
(45) Date of Patent: Jun. 30, 2015

(54) RESISTANCE STRUCTURE, INTEGRATED CIRCUIT, AND METHOD OF FABRICATING RESISTANCE STRUCTURE

(71) Applicant: LAPIS SEMICONDUCTOR CO., LTD., Yokohama (JP)

(72) Inventor: Hisao Ohtake, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 13/960,733

(22) Filed: Aug. 6, 2013

(65) Prior Publication Data
US 2014/0054746 A1 Feb. 27, 2014

(30) Foreign Application Priority Data

Aug. 21, 2012 (JP) ................................. 2012-182665

(51) Int. Cl.
  *H01L 49/02* (2006.01)
(52) U.S. Cl.
  CPC .......... *H01L 28/20* (2013.01); *H01L 2924/0002* (2013.01)
(58) Field of Classification Search
  CPC ....................................................... H02L 28/20
  See application file for complete search history.

(56) References Cited

U.S. PATENT DOCUMENTS

| 2005/0218520 | A1* | 10/2005 | Kikuta et al. | 257/758 |
| 2009/0302824 | A1* | 12/2009 | Kim et al. | 323/313 |
| 2012/0097910 | A1 | 4/2012 | Yamamura | |
| 2013/0341760 | A1* | 12/2013 | Kikuchi et al. | 257/536 |

FOREIGN PATENT DOCUMENTS

JP 2012-109535 A 6/2012

* cited by examiner

*Primary Examiner* — Whitney T Moore
(74) *Attorney, Agent, or Firm* — Studebaker & Brackett PC

(57) ABSTRACT

A resistance structure including: a conductive layer provided at a surface layer portion of a semiconductor substrate; a first resistance element having long sides and short sides provided over the conductive layer with an insulating film interposed; a second resistance element having long sides and short sides provided over the conductive layer with the insulating film interposed and disposed such that one long side thereof opposes one long side of the first resistance element; first wiring that is connected to one end of the first resistance element; second wiring that is connected to one end of the second resistance element; third wiring that connects the other end of the first resistance element with the other end of the second resistance element; and a connection portion that connects any of the first wiring, the second wiring and the third wiring with the conductive layer.

10 Claims, 11 Drawing Sheets

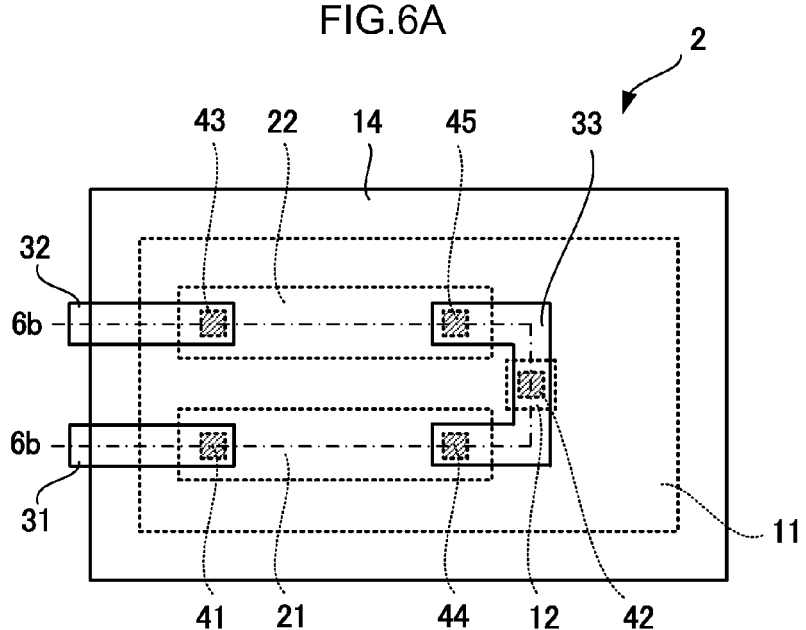
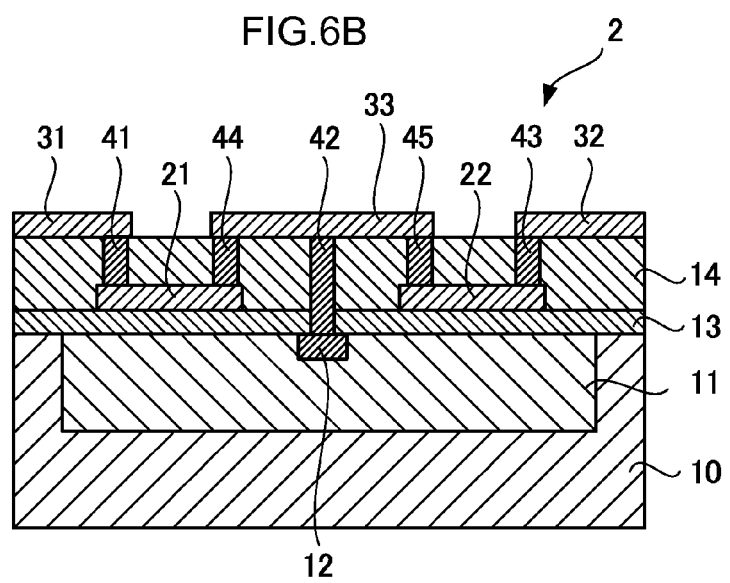

RESISTANCE STRUCTURE, INTEGRATED CIRCUIT, AND METHOD OF FABRICATING RESISTANCE STRUCTURE

CROSS-REFERENCE TO RELATED APPLICATION

This application is based on and claims priority under 35 USC 119 from Japanese Patent Application No. 2012-182665 filed on Aug. 21, 2012, the disclosure of which is incorporated by reference herein.

BACKGROUND

1. Technical Field

The present invention relates to a resistance structure, an integrated circuit and a method of fabricating a resistance structure.

2. Related Art

In a semiconductor integrated circuit, circuit components such as resistance elements (resistors), capacitors, transistors and so forth are combined to structure a desired electronic circuit.

Resistance elements include, for example, a resistance element that is constituted of polysilicon and formed on a semiconductor substrate with an insulating layer interposed. In this structure, a potential difference may be produced between the semiconductor substrate and the resistance element, and the resistance value of the resistance element may change. For example, if a voltage V1 is applied to a resistance element r1 and the semiconductor substrate is fixed at a ground potential, the potential difference between the semiconductor substrate and the resistance element r1 varies if the voltage V1 varies, and the resistance value of the resistance element r1 changes. In an electronic circuit in which, for example, an output voltage is regulated by a resistance ratio, such as a voltage division circuit, an amplification circuit, a level-shifting circuit or the like, the resistance ratio may vary in accordance with applied voltages, and errors may be produced in the output voltage.

In Japanese Patent Application Laid-Open (JP-A) No. 2012-109535, a resistance element is disclosed that may suppress resistance value variations caused by potential differences between a semiconductor substrate and the resistance element. Specifically, a resistance structure disclosed in in JP-A No. 2012-109535 is provided with: a resistance element layer that is formed on a semiconductor substrate with an insulating layer interposed; a first electrode that conducts at one end portion of the resistance element layer; a second electrode that conducts at the other end portion of the resistance layer; and a first conductive layer and a second conductive layer that are adjacent to a lower portion of the resistance element layer with an insulating layer interposed and are separated from one another. The first conductive layer is biased by the potential of the first electrode, and the second conductive layer is biased by the potential of the second electrode. According to this structure, variations in the resistance value due to potential differences between the semiconductor substrate and the resistance element layer may be suppressed by the first conductive layer and the second conductive layer.

In the resistance structure recited in JP-A No. 2012-109535, at a gap between the first conductive layer and the second conductive layer, the resistance element is adjacent to the semiconductor substrate. Consequently, the effect of suppressing variations in the resistance value of the resistance element that are caused by potential differences between the semiconductor substrate and the resistance element is weakened. Specifically, in a CMOS semiconductor integrated circuit, the first conductive layer and second conductive layer recited in JP-A No. 2012-109535 are assumed to be realized by well layers. In this case, so that the first conductive layer and the second conductive layer do not short-circuit together, a gap of the order of several µm or tens of µm is provided. At this gap, the resistance element layer may be affected by electric fields caused by potential differences with the semiconductor substrate, and the resistance value may change.

Furthermore, if a width dimension of a resistance element is represented by W and a length dimension is represented by L, it is commonly known that the inconsistency of resistance values between resistance elements is proportional to $1/(L \times W)^{1/2}$. That is, the smaller the area of a resistance element, the greater the inconsistency of the resistance value, and consequently the lower the accuracy of a resistance ratio. Accordingly, in order to suppress the inconsistency of resistance elements and raise resistance ratio accuracy, it is necessary to increase the length dimension L and the width dimension W of the resistance elements to some extent. However, in a structure that uses conductive layers to prevent resistance value variations due to potential differences between a resistance element and a semiconductor substrate, such as that recited in JP-A No. 2012-109535, the resistance element must be arranged within a region in which the conductive layers are formed. Therefore, it is difficult to significantly increase the length dimension L and the width dimension W of the resistance element. In other words, in a conventional structure, if the length dimension L and width dimension W of a resistance element are to be assured and resistance value inconsistency is to be reduced, measures such as enlarging a region of formation of a conductive layer are required. However, this leads to an increase in the area occupied by a resistance structure that includes this conductive layer.

SUMMARY

The present invention has been made in consideration of the points described above, and an object of the present invention is to provide a resistance structure, and a fabrication method thereof, with which resistance value variations of a resistance element that are caused by potential differences between a semiconductor substrate and the resistance element may be prevented, and resistance value inconsistency of the resistance element may be suppressed without being associated with an increase in occupancy area.

A first aspect of the present invention provides a resistance structure including:

a conductive layer provided at a surface layer portion of a semiconductor substrate;

a first resistance element having long sides and short sides that is provided over the conductive layer with an insulating film interposed;

a second resistance element having long sides and short sides that is provided over the conductive layer with the insulating film interposed and that is disposed such that one long side thereof opposes one long side of the first resistance element;

first wiring that is connected to one end of the first resistance element;

second wiring that is connected to one end of the second resistance element;

third wiring that connects the other end of the first resistance element with the other end of the second resistance element; and a connection portion that connects any of the first wiring, the second wiring and the third wiring with the conductive layer.

An integrated circuit according to the present invention is an integrated circuit that includes a plural number of the resistance structure described above, and that includes a first combined resistance and a second combined resistance that are structured by combined resistance elements being connected in series, each combined resistance element being formed of the first resistance element and the second resistance element.

A second aspect of the present invention provides a method of fabricating a resistance structure, method including:

forming a conductive layer at a surface layer portion of a semiconductor substrate;

forming an insulating film on the conductive layer;

forming a first resistance element having long sides and short sides on the insulating layer;

forming a second resistance element having long sides and short sides on the insulating layer such that one long side thereof opposes one long side of the first resistance element;

forming first wiring that is connected to one end of the first resistance element;

forming second wiring that is connected to one end of the second resistance element;

forming third wiring that connects the other end of the first resistance element with the other end of the second resistance element; and forming a connection portion that connects any of the first wiring, the second wiring and the third wiring with the conductive layer.

According to the resistance structure and fabrication method thereof relating to the present invention, resistance value variations of a resistance element that are caused by a potential difference between a semiconductor substrate and the resistance element may be prevented, and resistance value inconsistency of the resistance element may be suppressed without an increase in occupancy area being caused.

BRIEF DESCRIPTION OF THE DRAWINGS

An exemplary embodiment of the present invention will be described in detail based on the following figures, wherein:

FIG. 6A is a plan view showing a resistance structure in accordance with a second exemplary embodiment of the present invention;

FIG. 6B is a sectional view taken along line 6b-6b in FIG. 6A;

DETAILED DESCRIPTION

—First Exemplary Embodiment—

Figure 1A:
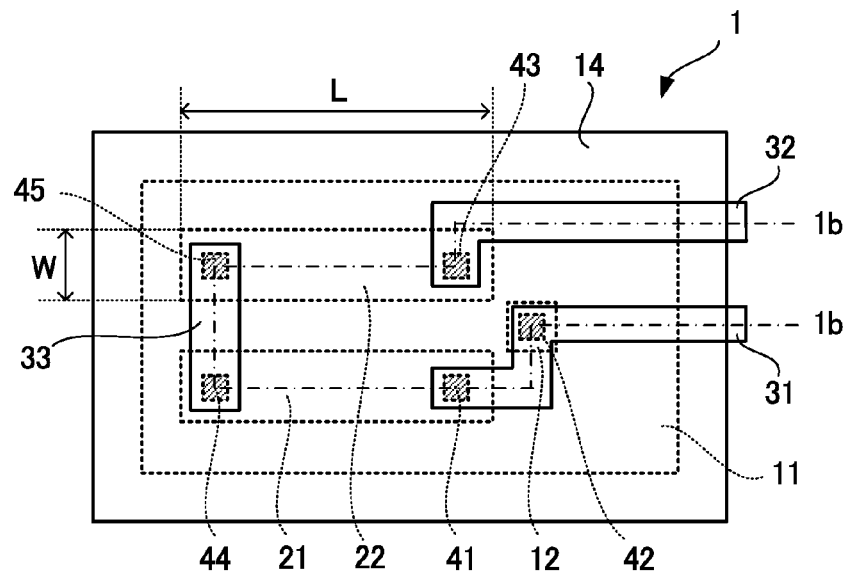
FIG. 1A is a plan view of a resistance structure in accordance with a first exemplary embodiment of the present invention.
Figure 1B:
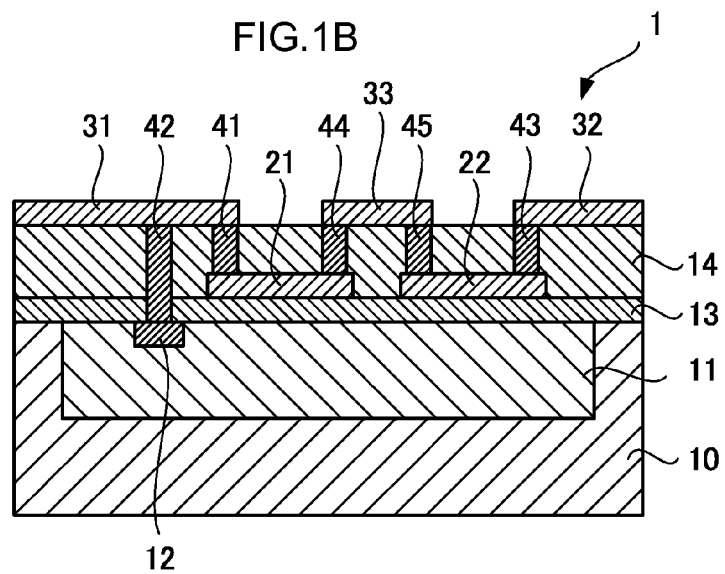
FIG. 1B is a sectional view taken along line 1b-1b in FIG. 1A.

FIG. 1A is a plan view showing the structure of a resistance structure 1 in accordance with a first exemplary embodiment of the present invention, and FIG. 1B is a sectional view taken along line 1b-1b in FIG. 1A.

A semiconductor substrate 10 is constituted by a silicon substrate with p-type conductivity. An n-well 11 is provided in the form of an island with n-type conductivity at a surface layer portion within the semiconductor substrate 10. The n-well 11 constitutes a conductive layer of the present invention.

A contact portion 12 is provided at the surface layer portion within the n-well 11. The contact portion 12 is for making contact between the n-well 11 and first wiring 31. The contact portion 12 is, for example, an n-type region with a higher doping density than the n-well 11.

A first insulation layer 13 is formed so as to cover the surface of the semiconductor substrate 10, and is constituted by an insulating material such as, for example, silicon dioxide or the like. The first insulation layer 13 is formed so as to cover at least the region in which the n-well 11 is formed. The first insulation layer 13 is interposed between the n-well 11 and a first resistance element 21 and a second resistance element 22, and electrically insulates the n-well 11 from these resistance elements.

The first resistance element 21 and the second resistance element 22 are constituted by a resistive material such as polysilicon or the like, and are disposed on the n-well 11 with the first insulation layer 13 interposed. That is, the first resistance element 21 and the second resistance element 22 are disposed so as to be contained within the region of formation of the n-well 11 in a plan view.

The first resistance element 21 and second resistance element 22 are each formed in a rectangular shape that has short sides and long sides. In the present exemplary embodiment, the lengths of the short sides of the first resistance element 21 and the second resistance element 22 (a width dimension W) are equal to one another, and the lengths of the long sides (a length dimension L) are also equal to one another. In other words, the first resistance element 21 and the second resistance element 22 have the same shape and the same size, and therefore have the same resistance value. Ordinarily, the resistance value of a resistance element is determined by the ratio of the width dimension W to the length dimension L. It is preferable if the first resistance element 21 and the second resistance element 22 are formed with large areas, within a range that is contained within the formation region of the n-well 11.

The first resistance element 21 and the second resistance element 22 are disposed side by side with a predetermined spacing in the short side direction. More specifically, the first resistance element 21 and the second resistance element 22 are disposed such that one long side of the first resistance element 21 opposes one long side of the second resistance element 22 in parallel therewith, and such that the respective short sides are disposed on collinear lines.

A second insulation layer 14 is constituted by an insulating material such as, for example, silicon dioxide or the like, and covers upper faces of the first resistance element 21 and the second resistance element 22. The first wiring 31, second wiring 32 and third wiring 33, which are formed of a conductive material such as, for example, aluminium (Al) or the like, are formed on the second insulation layer 14 by patterning in a predetermined pattern.

The first wiring 31 is electrically connected to one end of the first resistance element 21 via a contact plug 41 that penetrates through the second insulation layer 14. The first wiring 31 is also electrically connected to the contact portion 12 formed in the n-well 11 via the second insulation layer 14 and a contact plug 42 that penetrates through the first insulation layer 13. As shown in FIG. 1A, the contact portion 12 is disposed directly below a vicinity of an end portion of the first resistance element 21 at the side thereof at which the first wiring 31 is connected. Thus, the layout of the first wiring 31 is simple.

The second wiring 32 is electrically connected to one end of the second resistance element 22 via a contact plug 43 that penetrates through the second insulation layer 14. One end of the third wiring 33 is electrically connected to the other end of the first resistance element 21 via a contact plug 44 that penetrates through the second insulation layer 14, and the other end of the third wiring 33 is electrically connected to the other end of the second resistance element 22 via a contact plug 45 that penetrates through the second insulation layer 14. Thus, the first resistance element 21 and the second resistance element 22 are connected in series by the third wiring 33, and function as a single resistance element.

The contact plugs 41 to 45 may be constituted of the same material as the first to third wirings 31, 32 and 33 (for example, aluminium), or may be constituted of a different conductive material from the first to third wirings 31, 32 and 33 (for example, tungsten (W) or the like).

The present exemplary embodiment has a structure in which the second resistance element 22 is connected to the second wiring 32 at the end portion thereof that is at the same side as the end portion at which the first resistance element 21 and the first wiring 31 are connected. However, a structure is possible in which the second resistance element 22 is connected to the second wiring 32 at the end portion thereof that is at the opposite side from the end portion at which the first resistance element 21 and the first wiring 31 are connected. In this case, however, the length of the third wiring 33 becomes longer, as a result of which wiring resistance becomes larger.

Now, a method of fabricating the resistance structure 1 according to the above-described first exemplary embodiment of the present invention is described with reference to FIG. 2A to FIG. 4F.

FIG. 2A, FIG. 2B, FIG. 2C, FIG. 3A, FIG. 3B, FIG. 3C, FIG. 4A, FIG. 4B and FIG. 4C are plan views showing the fabrication method of the resistance structure 1, and FIG. 2D, FIG. 2E, FIG. 2F, FIG. 3D, FIG. 3E, FIG. 3F, FIG. 4D, FIG. 4E and FIG. 4F are corresponding sectional views.

Figure 2A:
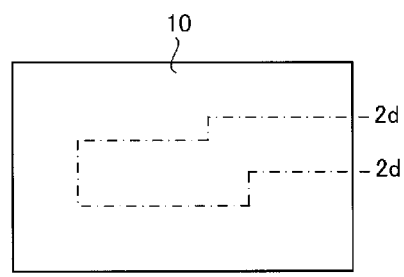
FIG. 2A, FIG. 2B and FIG. 2C are plan views showing a fabrication method of the resistance structure in accordance with the first exemplary embodiment of the present invention.
Figure 2D:
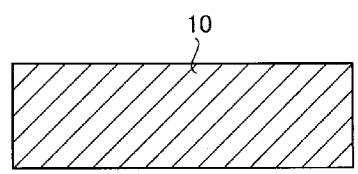
FIG. 2D, FIG. 2E and FIG. 2F are sectional views taken along line 2d-2d, line 2e-2e and line 2f-2f in, respectively, FIG. 2A, FIG. 2B and FIG. 2C.

First, the semiconductor substrate 10, which is a silicon substrate with p-type conductivity, is prepared (see FIG. 2A and FIG. 2D).

Figure 2B:
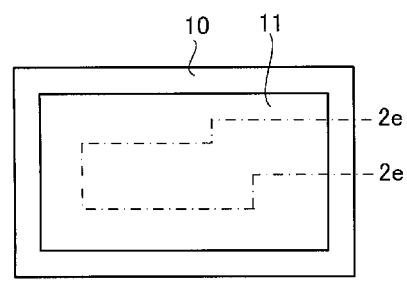
Figure 2E:
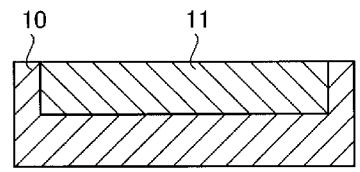

A resist (not shown in the drawings) is formed on the semiconductor substrate 10, and an opening portion is formed in the resist at a position corresponding with the region of formation of the n-well 11 by a widely known photolithography technique. Then, an n-type impurity such as phosphorus (P) or the like is ion-implanted into the surface of the semiconductor substrate 10 through this resist mask. Thereafter, the implanted phosphorus is dispersed in the depth direction of the semiconductor substrate 10 by the application of a heat treatment to the semiconductor substrate 10. Thus, the n-well 11 that serves as a conductive layer is formed at the surface portion of the semiconductor substrate 10 (FIG. 2B and FIG. 2E).

Figure 2C:
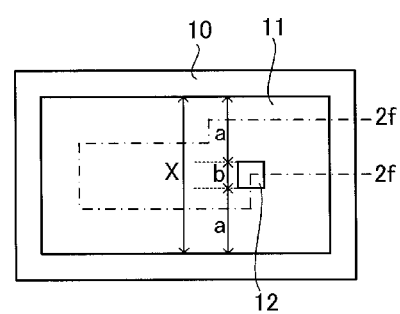
Figure 2F:
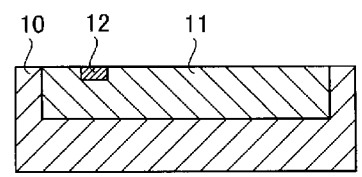

Then, a resist (not shown in the drawings) is formed on the semiconductor substrate 10 in which the n-well 11 has been formed, and an opening portion is formed in the resist at a position corresponding with the region of formation of the contact portion 12 by a widely known photolithography technique. Then, an n-type impurity such as arsenic (As) or the like is ion-implanted into the surface of the semiconductor substrate 10 through this resist mask. In this ion implantation, ions are implanted with higher dose amounts than in the preceding formation of the n-well 11. Thus, the contact portion 12 is formed with a high concentration at the surface of the n-well 11 (FIG. 2C and FIG. 2F).

The size of the n-well 11 and the disposition of the contact portion 12 must be determined such that distances between end portions of the n-well 11 and the contact portion 12 are not below predetermined design reference values. In the present exemplary embodiment, the contact portion 12 is arranged so as to be disposed in the middle of the n-well 11 in the direction of the short sides of the first resistance element 21 and second resistance element 22, and the size of the n-well 11 is determined such that distances from respective end portions of the n-well 11 to the contact portion 12 are a value "a" that satisfies respective design reference values. Accordingly, if the dimension of the contact portion 12 in the direction of the short sides is represented by "b", a minimum width dimension X of the n-well 11 in the direction of the short sides of the resistance elements may be expressed by X=2a+b. Thus, the minimum width dimension X of the n-well 11 is determined by the width b of the contact portion 12 and the design reference value a.

Figure 3A:
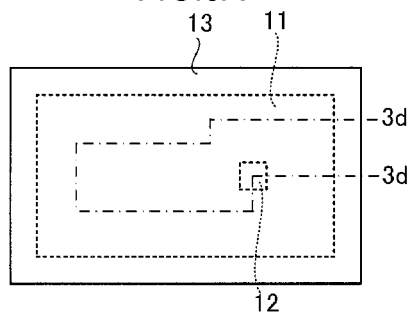
FIG. 3A, FIG. 3B and FIG. 3C are plan views showing the fabrication method of the resistance structure in accordance with the first exemplary embodiment of the present invention.
Figure 3D:
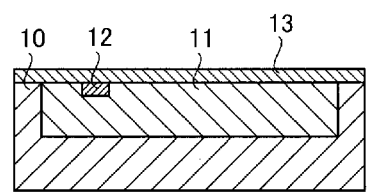
FIG. 3D, FIG. 3E and FIG. 3F are sectional views taken along line 3d-3d, line 3e-3e and line 3f-3f in, respectively, FIG. 3A, FIG. 3B and FIG. 3C.

Then, by chemical vapor deposition (CVD) using, for example, silane gas ($SiH_4$) and oxygen gas ($O_2$) as source gases, the first insulation layer 13 is formed of silicon dioxide to cover the whole surface of the semiconductor substrate 10 (FIG. 3A and FIG. 3D).

Figure 3B:
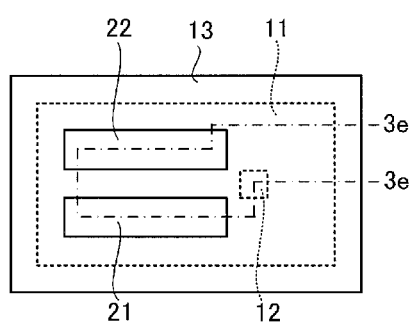
Figure 3E:
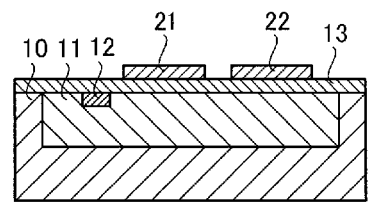

Then, by CVD in which, for example, silane gas ($SiH_4$) is thermally decomposed in a nitrogen gas ($N_2$) atmosphere and formed into a film, a polysilicon layer is formed over the first insulation layer 13. This polysilicon film is patterned using a widely known photolithography technique, forming the first resistance element 21 and the second resistance element 22 in the same size and the same shape as one another. The first resistance element 21 and second resistance element 22 are arranged so as to be contained within the formation region of the n-well 11 in plan view, and the first resistance element 21 and second resistance element 22 are arranged side by side such that long sides thereof oppose one another in parallel (FIG. 3B and FIG. 3E).

Figure 3C:
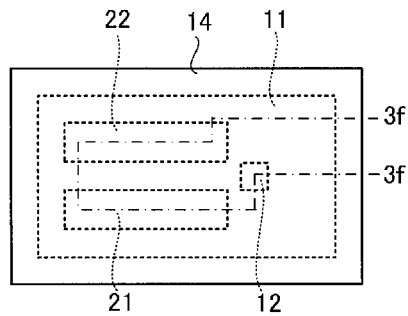
Figure 3F:
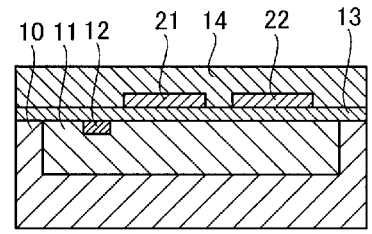

Then, by CVD using, for example, silane gas ($SiH_4$) and oxygen gas ($O_2$) as source gases, the second insulation layer 14 is formed of silicon dioxide to cover the first resistance element 21 and the second resistance element 22 (FIG. 3C and FIG. 3F).

Figure 4A:
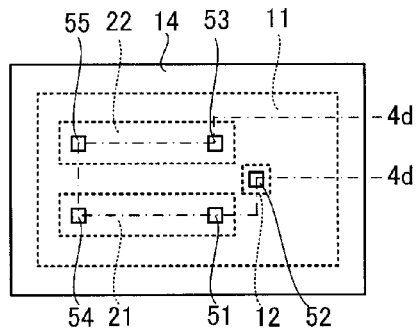
FIG. 4A, FIG. 4B and FIG. 4C are plan views showing the fabrication method of the resistance structure in accordance with the first exemplary embodiment of the present invention.
Figure 4D:
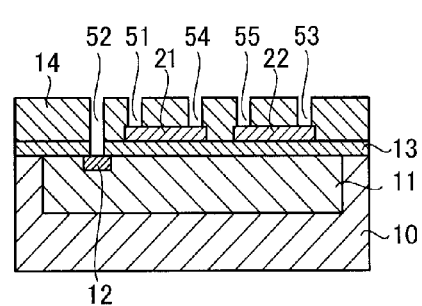
FIG. 4D, FIG. 4E and FIG. 4F are sectional views taken along line 4d-4d, line 4e-4e and line 4f-4f in, respectively, FIG. 4A, FIG. 4B and FIG. 4C.

Then, a resist mask (not shown in the drawings) with a predetermined opening pattern is formed at the upper face of the second insulation layer 14, and a dry-etching treatment is applied to the first insulation layer 13 and the second insulation layer 14 through this resist mask. Thus, contact holes 51, 52, 53, 54 and 55 are formed reaching from the upper face of the second insulation layer 14 to both ends of the first resistance element 21, both ends of the second resistance element 22, and the contact portion 12 (FIG. 4A and FIG. 4D).

Figure 4B:
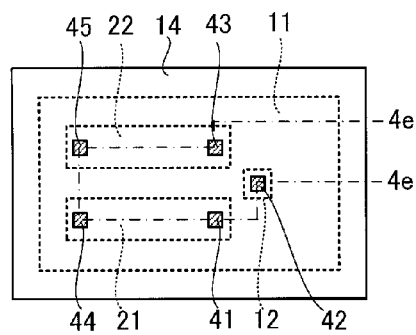
Figure 4E:
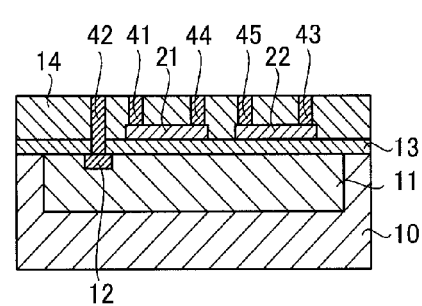

Then, by CVD using tungsten hexafluoride gas ($WF_6$) as a source gas, tungsten (W) is deposited onto the second insulation layer 14. At this time, the interiors of the contact holes 51 to 55 are filled with tungsten (W). Thereafter, the tungsten (W) deposited on top of the second insulation layer 14 is removed by chemical mechanical polishing (CMP). Thus, the contact plugs 41 and 44 electrically connecting to the first resistance element 21, the contact plugs 43 and 45 electrically connecting to the second resistance element 22, and the contact plug 42 electrically connecting to the contact portion 12 are formed (FIG. 4B and FIG. 4E). To improve area contact between the contact plugs 41 to 45 and the first insulation layer 13 and second insulation layer 14, the inner walls of the contact holes 51 to 55 may be covered with a film of titanium nitride or the like before the tungsten (W) is deposited on the second insulation layer 14.

Figure 4C:
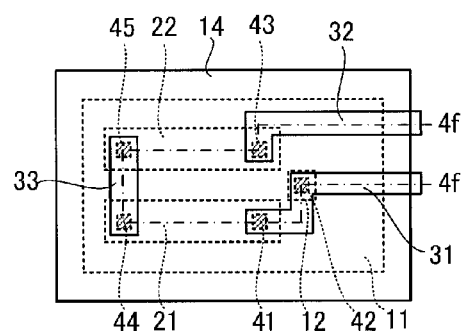
Figure 4F:
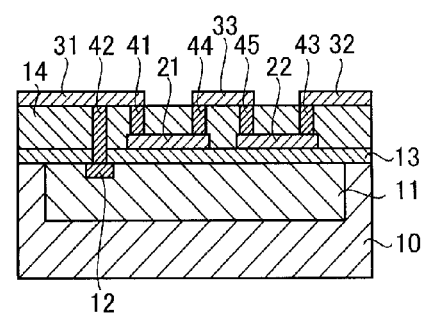

Then, aluminium (Al) is deposited on the second insulation layer 14 by sputtering, after which the aluminium film is patterned by a widely known photolithography technique. Thus, the first wiring 31 that is electrically connected to the contact plugs 41 and 42, the second wiring 32 that is electrically connected to the contact plug 43, and the third wiring 33 that is electrically connected to the contact plugs 44 and 45 are formed (FIG. 4C and FIG. 4F). The resistance structure 1 according to the present exemplary embodiment is completed by the performance of the steps described above.

A case in which a potential V1 is applied to the first wiring 31 of the resistance structure 1 according to the present exemplary embodiment and a potential V2 is applied to the second wiring 32 is considered. When the potential V1 is applied to the first wiring 31, the potential V1 is applied to the one end of the first resistance element 21 via the contact plug 41. When the potential V2 is applied to the second wiring 32, the potential V2 is applied to the one end of the second resistance element 22 via the contact plug 43. The potential V1 is also applied to the n-well 11 via the contact plug 42. Thus, because the first wiring 31 is electrically connected to the first resistance element 21 and the n-well 11, the potential of the n-well 11 changes so as to follow changes in the potential applied to the first resistance element 21. Therefore, a potential difference between the first wiring 31 of the first resistance element 21 and the n-well 11 is always at zero.

Thus, according to the resistance structure 1 in accordance with the present exemplary embodiment, the potential of the n-well 11 extending below the first resistance element 21 and second resistance element 22 changes to follow changes in the potential applied to the first resistance element 21. Therefore, even when there are changes in the potential V1 applied to the first wiring 31, changes in the effects of electric fields on the first resistance element 21 and the second resistance element 22 may be suppressed. Thus, variations in the resistance values of the first resistance element 21 and second resistance element 22 may be suppressed. For example, if the resistance structure 1 according to the present exemplary embodiment is employed in a circuit in which the difference between the potential V1 applied to the first wiring 31 and the potential V2 applied to the second wiring 32 is always substantially constant, variations in the resistance values of the first resistance element 21 and the second resistance element 22 due to variations in the applied potentials V1 and V2 may be kept substantially at zero.

Further, according to the resistance structure 1 in accordance with the present exemplary embodiment, the arrangement and dimensions are determined such that the first resistance element 21 and the second resistance element 22 are contained within the region of formation of the n-well 11. Thus, the first resistance element 21 and the second resistance element 22 do not include any regions that are adjacent to the semiconductor substrate 10. Therefore, compared with a conventional structure in which there is a region at which a resistance element and a semiconductor substrate are adjacent, the effect of suppressing variations in the resistance value of a resistance element that are caused by variations in an applied potential may be enhanced.

Figure 5A:
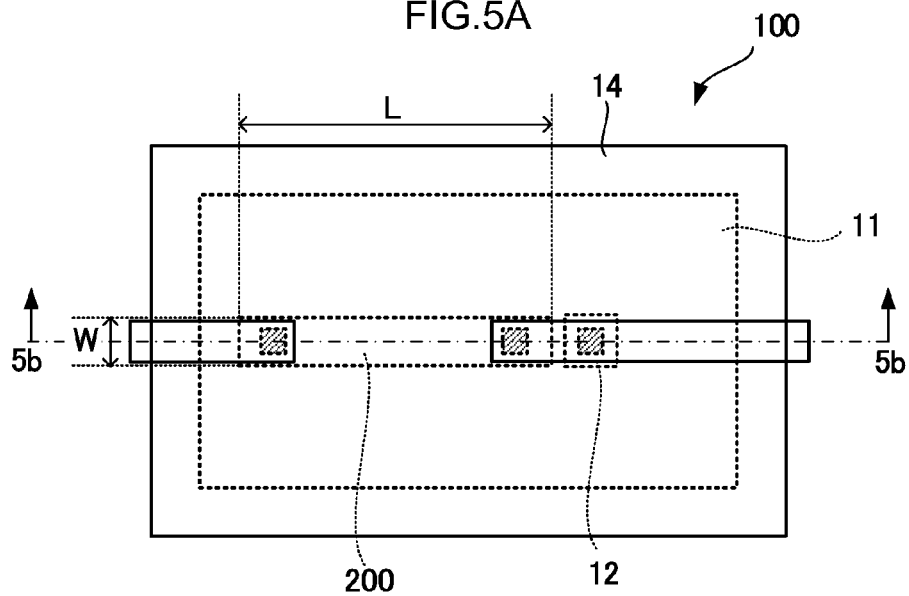
FIG. 5A is a plan view showing a resistance structure in accordance with a comparative example of the present invention.
Figure 5B:
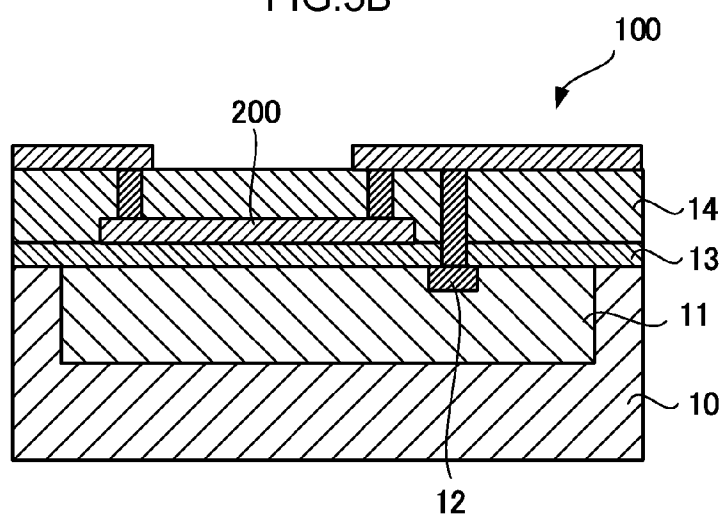
FIG. 5B is a sectional view taken along line 5b-5b in FIG. 5A.

FIG. 5A is a plan view of a resistance structure 100 in accordance with a comparative example, and FIG. 5B is a sectional view taken along line 5b-5b in FIG. 5A. Structural elements in FIG. 5A and FIG. 5B that are the same as in the resistance structure 1 according to the first exemplary embodiment of the present invention are assigned the same reference numerals.

The layer structure of the resistance structure 100 according to the comparative example is the same as in the resistance structure 1 according to the first exemplary embodiment of the present invention described above. The resistance structure 100 differs from the resistance structure 1 according to the first exemplary embodiment of the present invention in that only one resistance element is disposed above the n-well 11. That is, the resistance structure 100 according to the comparative example provides a required resistance value with a single resistance element 200, in the same structure as the resistance structure 1 according to the first exemplary embodiment of the present invention. The resistance element 200 is the same as the first resistance element 21 and the second resistance element 22 and the size and arrangement thereof are determined such that the resistance element 200 is contained within the formation region of the n-well 11.

As described above, the resistance value of a resistance element is determined by the ratio of a width dimension W to a length dimension L, and if a relatively large resistance value is to be provided, the value of L/W must be made larger. However, the length dimension L of these resistance elements is limited by the size of the n-well 11. Therefore, when a single resistance element is structured, as in the resistance structure 100 according to the comparative example, the width dimension W of the resistance element must be made smaller in order to provide a relatively large resistance. As mentioned above, inconsistency in the resistance values of resistance elements is proportional to $1/(L \times W)^{1/2}$. Therefore, if the width dimension W of the resistance element is made smaller, inconsistency of the resistance value becomes larger. As a result, the accuracy of a resistance ratio with another resistance element with the same structure falls. According to investigations by the present inventors, it has been found that when the inconsistency of the resistance value of a resistance element increases, inconsistency of the temperature coefficient of the resistant element also increases. That is, when inconsistency in the resistance values of resistance elements is larger, a range of variation in resistance ratios in accordance with temperature changes is larger. Thus, in the resistance structure 100 with the single resistance element 200 over the n-well 11, it is difficult to increase the area of the resistance element 200, and it is difficult to reduce inconsistency of the resistance value, a resistance ratio and the like.

Moreover, as described above, the minimum width dimension X of the n-well 11 is determined by the width b of the contact portion 12 and the design reference value a. That is, the n-well 11 is formed with a constant width dimension regardless of the width dimension W of the resistance element 200. Therefore, the formation region of the relatively large n-well 11 extends to both sides of the resistance element 200 in the short side direction thereof. Thus, the resistance structure 100 according to the comparative example does not have a layout in which the resistance element 200 efficiently utilizes the formation region of the n-well 11.

The resistance structure 1 according to the first exemplary embodiment of the present invention is structured such that a predetermined resistance value is provided by a combined resistance in which the first resistance element 21 and the second resistance element 22 are connected in series. The first resistance element 21 and second resistance element 22, each of which has a rectangular shape, are arranged in a row in the short side direction over the formation region of the n-well 11. Because the first resistance element 21 and the second resistance element 22 are put in this layout, the respective width dimensions W of the first resistance element 21 and second resistance element 22 may be made larger than that of the resistance element 200 according to the comparative example, and the overall area of a combined resistance element including the first resistance element 21 and the second resistance element 22 may be made larger than the resistance element 200 according to the comparative example. Thus, because the resistance element provided on the n-well 11 is divided into plural resistance elements and the plural divided resistance elements are arranged in a row in the short side direction, a layout that effectively utilizes the formation region of the n-well 11 may be formed.

Therefore, according to the resistance structure 1 relating to the first exemplary embodiment of the present invention, the overall area of the combined resistance element including the first resistance element 21 and the second resistance element 22 may be made larger without being associated with an increase in the area of the n-well 11. Accordingly, inconsistency of the resistance value of the combined resistance element formed of the first resistance element 21 and the second resistance element 22 may be made smaller than that of the resistance element 200 according to the comparative example. Hence, inconsistency of the temperature coefficient may also be suppressed, and the accuracy of a resistance ratio with another resistance element may be improved.

In the present exemplary embodiment, a structure in which the n-well 11 and the first wiring 31 are electrically connected via the contact plug 42 is illustrated. However, a structure in which the n-well 11 and the second wiring 32 are electrically connected via a contact plug is also possible.

—Second Exemplary Embodiment—

FIG. 6A is a plan view showing the structure of a resistance structure 2 in accordance with a second exemplary embodiment of the present invention, and FIG. 6B is a sectional view taken along line 6b-6b in FIG. 6A. Structural elements in FIG. 6A and FIG. 6B that are the same as in the resistance structure 1 according to the first exemplary embodiment are assigned the same reference numerals.

The resistance structure 2 according to the present exemplary embodiment as shown in FIG. 6B has the same layer structure as the resistance structure 1 according to the first exemplary embodiment described above. The sizes, shapes and arrangement of the first resistance element 21 and the second resistance element 22 are also the same as in the resistance structure 1 according to the above-described first exemplary embodiment. That is, the first resistance element 21 and the second resistance element 22 each has a rectangular shape with short sides and long sides. In the present exemplary embodiment, the length of the short sides of the first resistance element 21 (the width direction W) and the width dimension W of the second resistance element 22 are equal to one another, and the length of the long sides of the first resistance element 21 (the length dimension L) and the length dimension L of the second resistance element 22 are equal to one another. That is, the first resistance element 21 and the second resistance element 22 have the same shapes and sizes, and thus have the same resistance values. Again, the first resistance element 21 and the second resistance element 22 are arranged side by side with a predetermined spacing in the short side direction.

The first wiring 31 is electrically connected to the one end of the first resistance element 21 via the contact plug 41 that penetrates through the second insulation layer 14. The second wiring 32 is electrically connected to the one end of the second resistance element 22 via the contact plug 43 that penetrates through the second insulation layer 14. The one end of the third wiring 33 is electrically connected to the other end of the first resistance element 21 via the contact plug 44 that penetrates through the second insulation layer 14, and the other end of the third wiring 33 is electrically connected to the other end of the second resistance element 22 via the contact plug 45 that penetrates through the second insulation layer 14. That is, the first resistance element 21 and the second resistance element 22 are connected in series by the third wiring 33 and function as a single resistance element. The third wiring 33 is also electrically connected to the contact portion 12 formed in the n-well 11 via the contact plug 42 that penetrates through the second insulation layer 14 and the first insulation layer 13. Thus, in the resistance structure 2 according to the present exemplary embodiment, the n-well 11 is electrically connected to a connection point between the first resistance element 21 and the second resistance element 22.

A case in which a potential V1 is applied to the first wiring 31 of the resistance structure 2 according to the present exemplary embodiment and a potential V2 is applied to the second wiring 32 is considered. When the potential V1 is applied to the first wiring 31, the potential V1 is applied to the one end of the first resistance element 21 via the contact plug 41. When the potential V2 is applied to the second wiring 32, the potential V2 is applied to the one end of the second resistance element 22 via the contact plug 43. Because the resistance values of the first resistance element 21 and the second resistance element 22 are equal to one another, the potential of the third wiring 33 is at $(V1+V2)/2$. Because the n-well 11 is electrically connected to the third wiring 33 via the contact plug 42, the potential of the n-well 11 is also at $(V1+V2)/2$. Therefore, the potential difference between the portion of the first resistance element 21 that is connected to the third wiring 33 and the n-well 11 is always at zero. Meanwhile, the potential difference between the portion of the first resistance element 21 that is connected to the first wiring 31 and the n-well 11 is always at (V1−V2)/2. Similarly, the potential difference between the portion of the second resistance element 22 that is connected to the third wiring 33 and the n-well 11 is always at zero, and the potential difference between the portion of the second resistance element 22 that is connected to the second wiring 32 and the n-well 11 is always at (V1−V2)/2.

Thus, according to the resistance structure 2 in accordance with the present exemplary embodiment, the n-well 11 is set to a potential of (V1+V2)/2, between the potential V1 that is applied to the first resistance element 21 and the potential V2 that is applied to the second resistance element 22. Thus, a maximum value of potential differences between the first resistance element 21 and second resistance element 22 and the n-well 11 may be kept to approximately half that in the case of the first exemplary embodiment. Therefore, the effect of suppressing variations in the resistance values of the resistance elements that are caused by variations in the potentials V1 and V2 applied to the first resistance element 21 and second resistance element 22 may be further enhanced.

Furthermore, according to the resistance structure 2 in accordance with the present exemplary embodiment, similarly to the resistance structure 1 in accordance with the first exemplary embodiment, the overall area of the combined resistance element including the first resistance element 21 and the second resistance element 22 may be made larger without being associated with an increase in the area of the n-well 11. Thus, inconsistency of the resistance value of the combined resistance element may be made smaller than that of the single-structure resistance element 200 according to the comparative example. Hence, inconsistency of the temperature coefficient may also be suppressed, and the accuracy of a resistance ratio with another resistance element may be improved.

—Third Exemplary Embodiment—

Figure 7A:
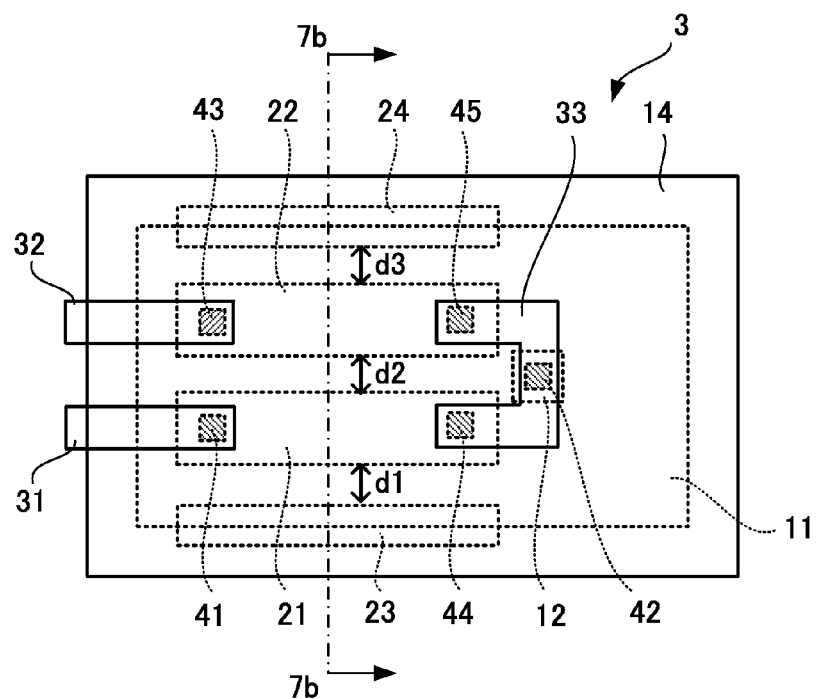
FIG. 7A is a plan view showing a resistance structure in accordance with a third exemplary embodiment of the present invention.
Figure 7B:
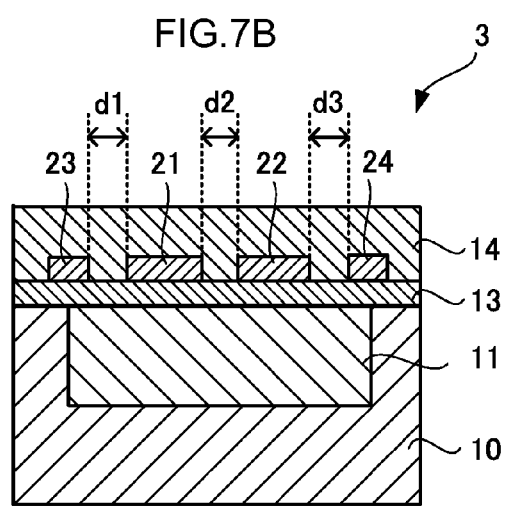
FIG. 7B is a sectional view taken along line 7b-7b in FIG. 7A.

FIG. 7A is a plan view showing the structure of a resistance structure 3 in accordance with a third exemplary embodiment of the present invention, and FIG. 7B is a sectional view taken along line 7b-7b in FIG. 7A. Structural elements in FIG. 7A and FIG. 7B that are the same as in the resistance structures 1 and 2 according to the first and second exemplary embodiments are assigned the same reference numerals.

The resistance structure 3 according to the present exemplary embodiment differs from the resistance structure 2 according to the second exemplary embodiment described above in that a third resistance element 23 and a fourth resistance element 24 are also included. The third resistance element 23 and the fourth resistance element 24 are disposed at outer sides of the first resistance element 21 and the second resistance element 22 so as to sandwich the same.

The third resistance element 23 and the fourth resistance element 24 are constituted of polysilicon, the same as the first resistance element 21 and the second resistance element 22, and each has a rectangular shape. The lengths of the long sides (the length dimension L) of the third resistance element 23 and the fourth resistance element 24 in the present exemplary embodiment are equal to the lengths of the long sides (the length dimension L) of the first resistance element 21 and the second resistance element 22. However, the lengths of the short sides (the width dimension W) of the third resistance element 23 and the fourth resistance element 24 may be smaller than the lengths of the short sides (the width dimension W) of the first resistance element 21 and the second resistance element 22.

The third resistance element 23 is provided adjacent to the first resistance element 21 such that a long side of the third resistance element 23 opposes a long side of the first resistance element 21 in parallel. Similarly, the fourth resistance element 24 is provided adjacent to the second resistance element 22 such that a long side of the fourth resistance element 24 opposes a long side of the second resistance element 22 in parallel. A spacing d1 between the third resistance element 23 and the first resistance element 21 is equal to a spacing d2 between the first resistance element 21 and the second resistance element 22, and a spacing d3 between the fourth resistance element 24 and the second resistance element 22 is equal to the spacing d2 between the first resistance element 21 and the second resistance element 22. That is, these spacings of the resistance elements are determined such that d1=d2=d3 in the present exemplary embodiment. No wiring for applying potentials or the like is connected to the third resistance element 23 or the fourth resistance element 24. That is, the third resistance element 23 and the fourth resistance element 24 are "dummy" resistance elements which do not function as circuit elements.

Figure 8A:
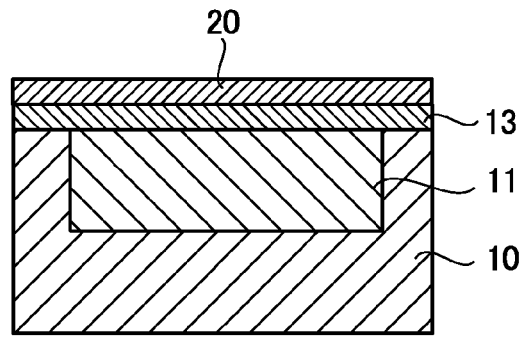
FIG. 8A, FIG. 8B and FIG. 8C are sectional views showing a fabrication method of the resistance structure in accordance with the third exemplary embodiment of the present invention.
Figure 8B:
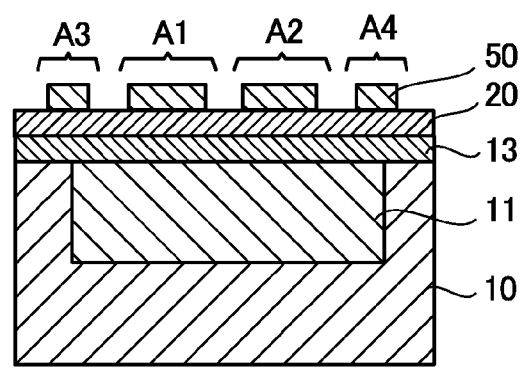
Figure 8C:
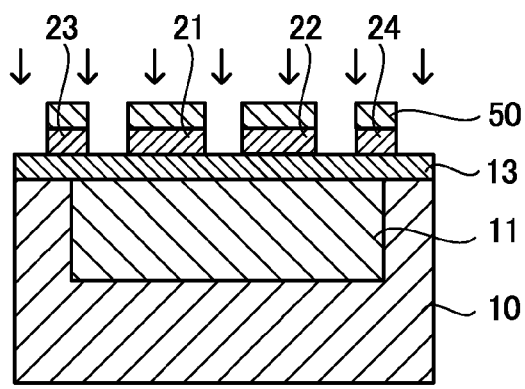

Herebelow, a fabrication method of the resistance structure 3 according to the present exemplary embodiment with the structure described above is described. Steps up to the formation of the polysilicon layer that constitutes the first to fourth resistance elements 21 to 24 on the first insulation layer 13 are the same as in the first exemplary embodiment described above. Steps subsequent to the formation of the polysilicon layer are described with reference to FIG. 8A, FIG. 8B, and FIG. 8C. FIG. 8A to FIG. 8C are views showing the fabrication method of the resistance structure 3, and are sectional views showing the same section as FIG. 7B.

After the formation of the first insulation layer 13, a polysilicon film 20 is formed on the first insulation layer 13 by, for example, CVD in which silane gas ($SiH_4$) is thermally decomposed in a nitrogen gas ($N_2$) atmosphere and formed into a film (FIG. 8A).

Then, a resist film is formed on the polysilicon film 20, and this resist film is subjected to light exposure and development to perform patterning and form a resist mask 50. That is, the resist mask 50 is formed to cover the upper face of the polysilicon film 20 at a first region A1 corresponding to the region of formation of the first resistance element 21, a second region A2 corresponding to the region of formation of the second resistance element 22, a third region A3 corresponding to the region of formation of the third resistance element 23 and a fourth region A4 corresponding to the region of formation of the fourth resistance element 24 (FIG. 8B).

Then, the polysilicon film 20 is patterned by a dry etching treatment through the resist mask 50 (FIG. 8C). The exposure of etching ions onto the side faces at the long sides of the first resistance element 21 is limited by the second resistance element 22 and the third resistance element 23. Therefore, over-etching of the side faces of the long sides is restricted and precision of the width dimension W may be improved. Similarly, because the exposure of etching ions onto the side faces at the long sides of the second resistance element 22 is limited by the first resistance element 21 and the fourth resistance element 24, over-etching of the side faces of the long sides is restricted and precision of the width dimension W of the second resistance element 22 may be improved. Thus, etching control characteristics for the side faces of the long sides of the first resistance element 21 and the second resistance element 22 may be improved by the third resistance element 23 and the fourth resistance element 24 that are dummy resistance elements being provided adjacent to the outer sides of the first resistance element 21 and the second resistance element 22. As a result, patterning precision of the first resistance element 21 and the second resistance element 22 may be improved, and consequently the accuracy of the resistance values may be increased. Because the spacing d1 between the third resistance element 23 and the first resistance element 21, the spacing d2 between the first resistance element 21 and the second resistance element 22 and the spacing d3 between the second resistance element 22 and the fourth resistance element 24 are equal to one another, the respective side faces of the long sides of the first resistance element 21 and the second resistance element 22 may be etched uniformly, and etching control characteristics may be further improved. Subsequent fabrication steps are the same as for the resistance structure 1 according to the above-described first exemplary embodiment, so are not described here.

Thus, according to the resistance structure 3 in accordance with the present exemplary embodiment, similarly to the resistance structures 1 and 2 in accordance with the first and second exemplary embodiments, the overall area of the combined resistance element including the first resistance element 21 and the second resistance element 22 may be made larger without being associated with an increase in the area of the n-well 11. Thus, inconsistency of the resistance value of the combined resistance element may be made smaller than that of the single-structure resistance element 200 according to the comparative example. Hence, inconsistency of the temperature coefficient may also be suppressed, and the accuracy of a resistance ratio with another resistance element may be improved. In addition, according to the resistance structure 3 in accordance with the present exemplary embodiment, because the third resistance element 23 and fourth resistance element 24 are provided at the outer sides of the first resistance element 21 and second resistance element 22 so as to be adjacent thereto, etching control characteristics when the first resistance element 21 and the second resistance element 22 are being patterned may be improved, and differences of the resistance values of the resistance elements from design values may be reduced.

In the present exemplary embodiment, a case in which the third resistance element 23 and fourth resistance element 24 are added to the structures of the resistance structure 2 according to the above-described second exemplary embodiment is described. The third resistance element 23 and fourth resistance element 24 could also be added to the structures of the resistance structure 1 according to the first exemplary embodiment.

Figure 9:
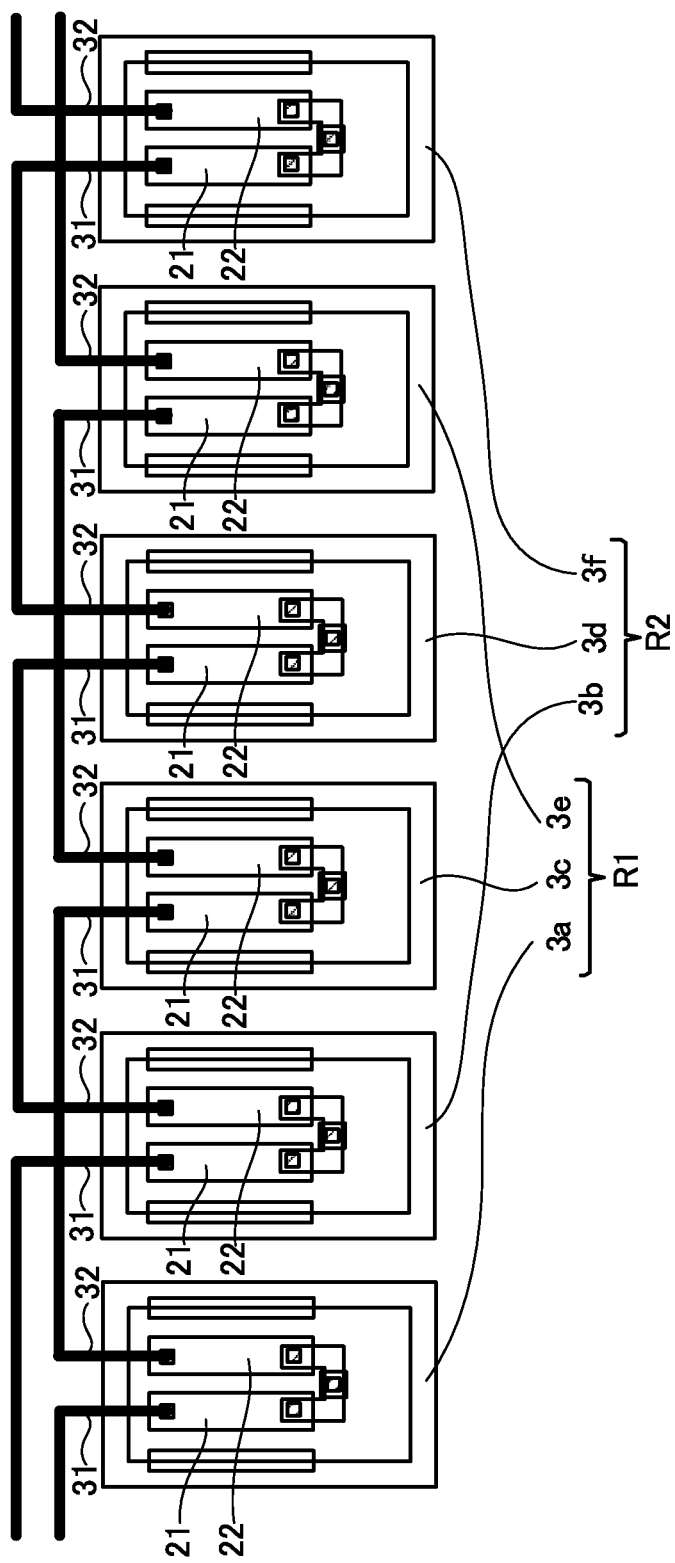
FIG. 9 is a plan view showing a layout of combined resistances formed of plural numbers of resistance structures in accordance with an exemplary embodiment of the present invention.
Figure 10:
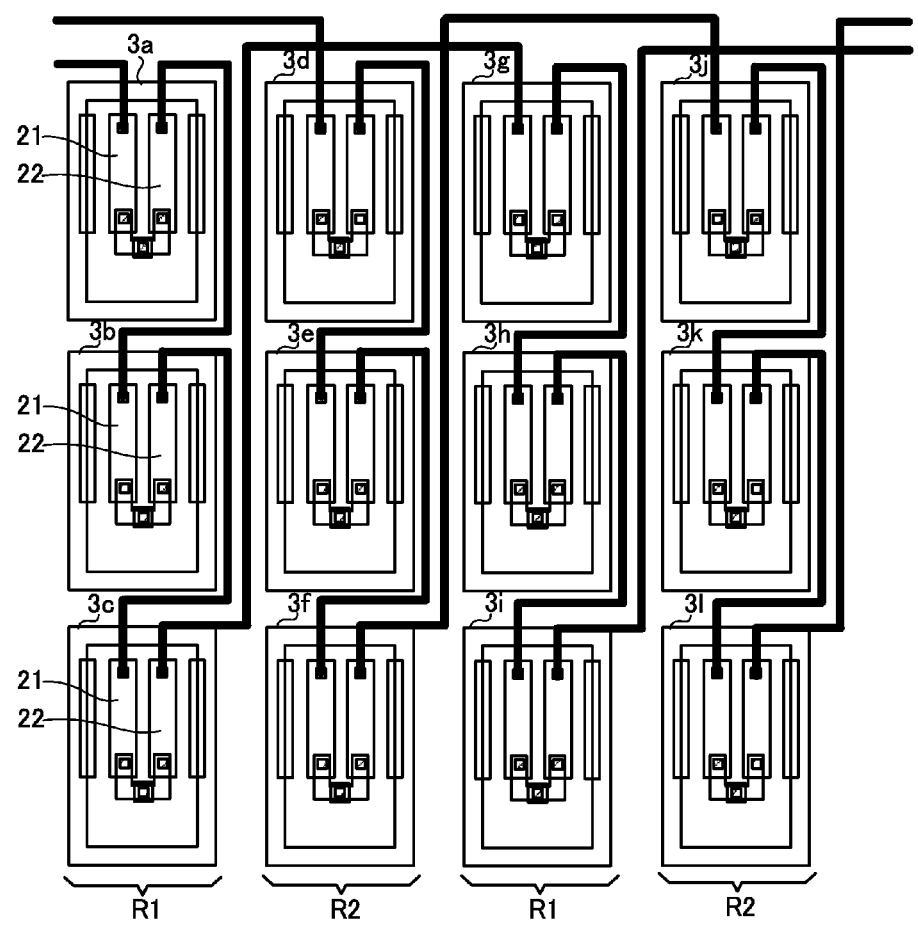
FIG. 10 is a plan view showing a layout of combined resistances formed of plural numbers of resistance structures in accordance with embodiments of the present invention.

FIG. 9 and FIG. 10 are plan views each illustrating a layout when plural numbers of resistance structures, each with the same structure as the resistance structure 3 according to the third exemplary embodiment described above, are combined to structure two combined resistances.

In the example shown in FIG. 9, six resistance structures 3a to 3f are arranged in a row so as to form a single row along the direction of the row in which each first resistance element 21 and second resistance element 22 are arranged. In the example shown in FIG. 9, the second wiring 32 of the resistance structure 3a is electrically connected with the first wiring 31 of the resistance structure 3c, and the second wiring 32 of the resistance structure 3c is electrically connected with the first wiring 31 of the resistance structure 3e. Thus, the resistance elements of the resistance structures 3a, 3c and 3e are connected in series to structure a combined resistance R1. Similarly, the second wiring 32 of the resistance structure 3b is electrically connected with the first wiring 31 of the resistance structure 3d, and the second wiring 32 of the resistance structure 3d is electrically connected with the first wiring 31 of the resistance structure 3f. Thus, the resistance elements of the resistance structures 3b, 3d and 3f are connected in series to structure a combined resistance R2. The combined resistance R1 and the combined resistance R2 are, for example, embedded to serve as a portion of a semiconductor integrated circuit that sets an output voltage in accordance with the ratio of the resistance values thereof. The resistance values of the combined resistance R1 and combined resistance R2 may be the same as one another, and may be different.

As described above, according to the resistance structures in accordance with the exemplary embodiments of the present invention, inconsistency of the resistance value of a combined resistance formed by the first resistance element 21 and second resistance element 22, and inconsistency of the temperature coefficient thereof, may be suppressed. Therefore, inconsistency of the resistance values and temperature coefficients of the combined resistance R1 and combined resistance R2 may be suppressed, and inconsistency of a resistance ratio between the combined resistances R1 and R2 may be suppressed.

The resistance structures 3a, 3c and 3e structuring the combined resistance R1 and the resistance structures 3b, 3d and 3f structuring the combined resistance R2 are alternatingly arranged. For example, the resistance structure 3b structuring the combined resistance R2 is disposed between the resistance structures 3a and 3c structuring the combined resistance R1 and, correspondingly, the resistance structure 3c structuring the combined resistance R1 is disposed between the resistance structures 3b and 3d structuring the combined resistance R2. The resistance values of resistance structures are thought to be dependent on arrangements thereof. That is, one resistance structure may have a different resistance value from another resistance structure that is disposed at a position separated from the one resistance structure. Because the resistance structures 3a, 3c and 3e structuring the combined resistance R1 and the resistance structures 3b, 3d and 3f structuring the combined resistance R2 are alternatingly arranged, the arrangement dependencies of the resistance values may be absorbed and the resistance ratio between the combined resistance R1 and the combined resistance R2 may be kept constant.

In the example shown in FIG. 10, twelve resistance elements 3a to 3l are arranged in a pattern of four columns by three rows. In this example, the resistance elements of the resistance structures 3a, 3b and 3c in the first column and the resistance elements of the resistance structures 3g, 3h and 3i in the third column are connected in series to structure a combined resistance R1, and the resistance elements of the resistance structures 3d, 3e and 3f in the second column and the resistance elements of the resistance structures 3j, 3k and 3l in the fourth column are connected in series to structure a combined resistance R2. The combined resistance R1 and the combined resistance R2 are, for example, embedded to serve as a portion of a semiconductor integrated circuit that sets an output voltage in accordance with the ratio of the resistance values of the combined resistances R1 and R2.

Because the plural resistance structures that structure the combined resistances R1 and R2 are in a layout that is arranged as a matrix, there is an advantage over a linear layout as illustrated in FIG. 9, in that space for arrangement of the resistance structures may be more easily reserved.

Furthermore, because the columns of the resistance structures structuring the combined resistance R1 and the columns of the resistance structures structuring the combined resistance R2 are alternatingly arranged, similarly to the layout of FIG. 9, the effects of arrangement dependencies of the resistance values of the resistance structures may be absorbed, and the resistance ratio between the combined resistances R1 and R2 may be kept constant.

The resistance structures 1 and 2 according to the first and second exemplary embodiments may also be employed in layouts as illustrated in FIG. 9 and FIG. 10.

In the exemplary embodiments described above, cases in which the first resistance element 21 and the second resistance element 22 are formed over the n-well 11 are illustrated. However, three or more resistance elements may be provided over the n-well 11.

In the exemplary embodiments described above, cases are illustrated in which the first resistance element 21 and the second resistance element 22 are formed in the same shape and the same size, and have the same resistance value. However, the first resistance element 21 and the second resistance element 22 may be formed with different shapes and sizes from one another and may have different resistance values from one another.

In the exemplary embodiments described above, cases are illustrated in which the n-well 11 is formed on the p-type semiconductor substrate 10, and the first and second resistance elements 21 and 22 are formed on the n-well 11 with the first insulation layer 13 therebetween. However, the conduction types of the semiconductor substrate and the well region may be suitably altered. Moreover, a well-in-well structure in which a p-well is formed within the n-well 11 may be formed, and the first resistance element 21 and second resistance element 22 may be formed over this p-well.

In the exemplary embodiments described above, cases are illustrated in which the single contact portion 12 is provided in the n-well 11. However, a structure may be formed in which a plural number of the contact portion 12 are provided in the n-well 11, and the same potential is applied to each contact portion 12 via the wirings and the contact plugs. A potential distribution within the n-well 11 may be made uniform by applying a potential to the n-well 11 from a plural number of locations in this manner.

Figure 11A:
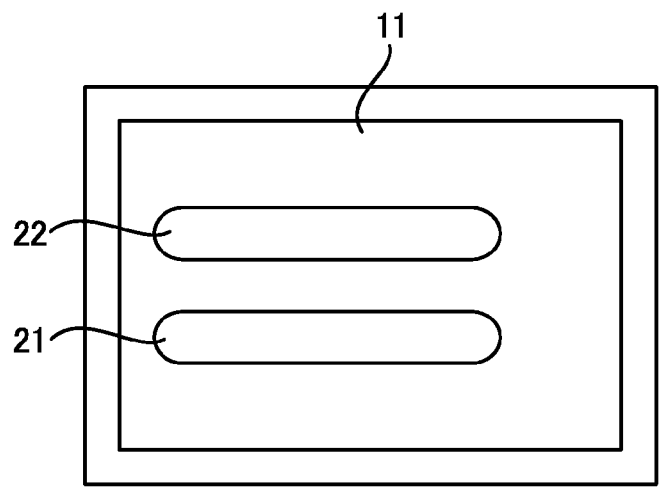
FIG. 11A and FIG. 11B are plan views of resistance structures in accordance with embodiments of the present invention.
Figure 11B:
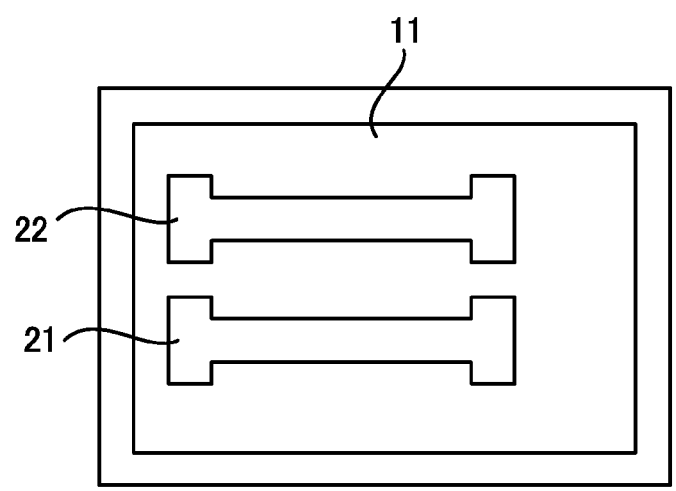

In the exemplary embodiments described above, the shapes of the first resistance element 21 and the second resistance element 22 are rectangular shapes, but this is not a limitation. It is sufficient for the first resistance element 21 and second resistance element 22 to have long, narrow shapes overall with which a length direction may be specified. For example, as shown in FIG. 11A, the first resistance element 21 and second resistance element 22 may include curvilinear portions, and as shown in FIG. 11B, the first resistance element 21 and second resistance element 22 may include protruding portions.

In the exemplary embodiments described above, cases are illustrated in which the resistance structures are formed using CMOS processes. However, bipolar processes may be used, in which case realization is possible by using an epitaxial layer as the conductive layer instead of the above-described n-well 11 and implementing insulative separation with element separation regions.

The fabrication method of the resistance structure 1 is described with reference to FIG. 2A to FIG. 4F, but these fabrication steps are not limiting. The materials that are used, film formation techniques, step sequences and so forth may be altered as appropriate.

What is claimed is:

1. A resistance structure comprising:
   a well formed in a semiconductor substrate;
   a first resistance element having long sides and short sides that is provided over the well with an insulating film interposed;
   a second resistance element having long sides and short sides that is provided over the well with the insulating film interposed and that is disposed side by side in the short side direction such that one long side thereof opposes one long side of the first resistance element;
   first wiring that is connected to one end of the first resistance element;
   second wiring that is connected to one end of the second resistance element;
   third wiring that connects the other end of the first resistance element with the other end of the second resistance element; and
   a connection portion that connects any of the first wiring, the second wiring and the third wiring with the well;
   wherein the first resistance element and the second resistance element are disposed so as to be contained within the region of formation of the well from a plan view perspective.

2. The resistance structure according to claim 1, further comprising a third resistance element and a fourth resistance element, each having long sides and short sides that are provided so as to sandwich the first resistance element and the second resistance element,
   wherein the third resistance element is disposed adjacent to the first resistance element side by side in the short side direction such that one long side thereof opposes one long side of the first resistance element, and
   the fourth resistance element is disposed adjacent to the second resistance element side by side in the short side direction such that one long side thereof opposes one long side of the second resistance element.

3. The resistance structure according to claim 2, wherein a spacing between the third resistance element and the first resistance element and a spacing between the fourth resistance element and the second resistance element are the same as a spacing between the first resistance element and the second resistance element.

4. The resistance structure according to claim 2, wherein the third resistance element and the fourth resistance element are electrically isolated from other portions.

5. The resistance structure according to claim 1, wherein the first resistance element and the second resistance element are the same in shape and size.

6. An integrated circuit comprising a plurality of the resistance structure according to claim 1, the integrated circuit comprising a first combined resistance and a second combined resistance that include structures in which combined resistance elements are connected in series, each combined resistance element including the first resistance element and the second resistance element.

7. The integrated circuit according to claim 6, wherein the resistance structures structuring the first combined resistance and the resistance structures structuring the second combined resistance are alternatingly arranged.

8. A method of fabricating a resistance structure, method comprising:
   forming a well in a semiconductor substrate;
   forming an insulating film on the well;
   forming a first resistance element having long sides and short sides on the insulating layer;
   forming a second resistance element having long sides and short sides on the insulating layer side by side in the short side direction with the first resistive element such that one long side thereof opposes one long side of the first resistance element;
   forming first wiring that is connected to one end of the first resistance element;
   forming second wiring that is connected to one end of the second resistance element;

forming third wiring that connects the other end of the first resistance element with the other end of the second resistance element; and forming a connection portion that connects any of the first wiring, the second wiring and the third wiring with the well;

wherein the first resistance element and the second resistance element are disposed so as to be contained within the region of formation of the well from a plan view perspective.

9. The method according to claim 8, wherein forming the first resistance element and forming the second resistance element comprises:

forming a film of a resistive material that is to structure the first resistance element and the second resistance element on the insulating film;

forming a resist mask that covers the surface of the resistive material at a first region that corresponds with a region of formation of the first resistance element, a second region that corresponds with a region of formation of the second resistance element, a third region that neighbors the first region with a predetermined spacing therebetween and a fourth region that neighbors the second region with a predetermined spacing therebetween; and etching the resistive material through the resist mask.

10. The method according to claim 9, wherein the spacing between a portion of the resist mask that covers the third region and a portion that covers the first region, the spacing between the portion of the resist mask that covers the first region and a portion that covers the second region, and the spacing between the portion of the resist mask that covers the second region and a portion that covers the fourth region are equal to one another.

* * * * *